United States Patent
Shin et al.

(10) Patent No.: US 10,666,224 B2
(45) Date of Patent: *May 26, 2020

(54) BULK ACOUSTIC WAVE RESONATOR

(71) Applicant: Samsung Electronics Co., Ltd., Suwon-si (KR)

(72) Inventors: Jea Shik Shin, Hwaseong-si (KR); Duck Hwan Kim, Goyang-si (KR); Chul Soo Kim, Hwaseong-si (KR); Sang Uk Son, Yongin-si (KR); In Sang Song, Osan-si (KR); Moon Chul Lee, Seongnam-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 406 days.

This patent is subject to a terminal disclaimer.

(21) Appl. No.: 15/494,866

(22) Filed: Apr. 24, 2017

(65) Prior Publication Data

US 2017/0250672 A1    Aug. 31, 2017

Related U.S. Application Data

(63) Continuation of application No. 13/691,114, filed on Nov. 30, 2012, now Pat. No. 9,634,643.

(30) Foreign Application Priority Data

Dec. 1, 2011 (KR) .................. 10-2011-0127686

(51) Int. Cl.
*H03H 3/02* (2006.01)
*H03H 9/17* (2006.01)
*H03H 9/02* (2006.01)

(52) U.S. Cl.
CPC .............. *H03H 9/173* (2013.01); *H03H 3/02* (2013.01); *H03H 9/02118* (2013.01); *H03H 2003/021* (2013.01); *Y10T 29/42* (2015.01)

(58) Field of Classification Search
CPC ....... H03H 9/173; H03H 9/02118; H03H 3/02
See application file for complete search history.

(56) References Cited

U.S. PATENT DOCUMENTS 6,732,415 B2    5/2004 Nakatani et al.
9,634,643 B2 *  4/2017 Shin .................. H03H 9/173
(Continued)

FOREIGN PATENT DOCUMENTS

CN    1450719 A    10/2003
CN    1645640 A    7/2005
(Continued)

OTHER PUBLICATIONS

Japanese Office Action dated Nov. 28, 2017 in corresponding Japanese Patent Application No. 2016-157882 (2 pages in English and 3 pages in Japanese).
(Continued)

*Primary Examiner* — Thomas M Dougherty
*Assistant Examiner* — Karen B Addison
(74) *Attorney, Agent, or Firm* — NSIP Law

(57) ABSTRACT

Disclosed is a bulk acoustic wave resonator (BAWR). The BAWR includes a bulk acoustic wave resonance unit with a first electrode, a second electrode, and a piezoelectric layer. The piezoelectric layer is disposed between the first electrode and the second electrode. An air edge is formed at a distance from a center of the bulk acoustic wave resonance unit.

30 Claims, 12 Drawing Sheets

(56) References Cited

U.S. PATENT DOCUMENTS

| | | | |
|---|---|---|---|
| 2005/0093397 A1 | 5/2005 | Yamada et al. | |
| 2005/0275486 A1 | 12/2005 | Feng et al. | |
| 2006/0071736 A1 | 4/2006 | Ruby et al. | |
| 2006/0226932 A1 | 10/2006 | Fazzio et al. | |
| 2008/0129414 A1* | 6/2008 | Lobl | H03H 3/04 333/187 |
| 2009/0127978 A1 | 5/2009 | Asai et al. | |
| 2009/0206706 A1 | 8/2009 | Iwaki et al. | |
| 2010/0033063 A1 | 2/2010 | Nishihara et al. | |
| 2010/0112233 A1 | 5/2010 | Iwamoto et al. | |
| 2010/0148636 A1 | 6/2010 | Nishihara et al. | |
| 2010/0237750 A1 | 9/2010 | Sakashita et al. | |
| 2012/0319534 A1* | 12/2012 | Shirakawa | H03H 3/02 310/365 |

FOREIGN PATENT DOCUMENTS

| | | |
|---|---|---|
| CN | 101465628 A | 6/2009 |
| EP | 1 533 896 A2 | 11/2004 |
| EP | 1 653 612 A2 | 10/2005 |
| JP | 62-266906 A | 11/1987 |
| JP | 8-274573 A | 10/1996 |
| JP | 2003-17964 A | 1/2003 |
| JP | 2004-357100 A | 12/2004 |
| JP | 2006-295380 A | 10/2006 |
| JP | 2008-236743 A | 10/2008 |
| JP | 2009-124640 A | 6/2009 |
| JP | 2009-200714 A | 9/2009 |
| JP | 2010-45437 A | 2/2010 |
| JP | 2010-109950 A | 5/2010 |
| JP | 2010-147874 A | 7/2010 |
| JP | 2010-147875 A | 7/2010 |
| JP | 2010-154233 A | 7/2010 |
| JP | 2011-18675 A | 1/2011 |
| KR | 2003-0006889 A | 1/2003 |
| KR | 10-2005-0066104 A | 6/2005 |
| KR | 10-2006-0049516 A | 5/2006 |
| KR | 10-2006-0052188 A | 5/2006 |
| KR | 10-2006-0095528 A | 8/2006 |
| KR | 10-2010-0111724 A | 10/2010 |
| KR | 10-2011-0005232 A | 1/2011 |
| WO | WO 2007/119643 A1 | 10/2007 |
| WO | WO 2011/099381 A1 | 8/2011 |

OTHER PUBLICATIONS

Korean Office Action dated Aug. 29, 2017 in corresponding Korean Patent Application No. 10-2011-0127686 (2 pages in English and 4 pages in Korean).

Pang, Wei, et al. "High Q film bulk acoustic resonator from 2.4 to 5.1 GHz." *Micro Electro Mechanical Systems, 2004*. 17th IEEE International Conference on.(MEMS). IEEE, 2004.

R. Thalhammer et al. "Spurious Mode Suppression in BAW Resonators", Ultrasonics Symposium, Oct. 2006, p. 456-459, IEEE.

International Search Report dated Mar. 28, 2013 in the counterpart International Application No. PCT/KR2012/009847 (3 pages, in English).

Supplementary Partial European Search Report issued in corresponding Eurpean Patent Application No. 12852528.4 dated Jul. 2, 2015.

Extended European Search Report dated Jan. 8, 2016 in counterpart European Patent Application No. 12852528.4 (21 pages in English).

Chinese Office Action dated Jan. 13, 2016 in counterpart Chinese Patent Application No. 201280058899.1 (15 pages in English; 10 pages in Chinese).

Japanese Office Action dated Jan. 19, 2016 in counterpart Japanese Application No. 2014-544656. (7 pages in Japanese with English translation).

\* cited by examiner

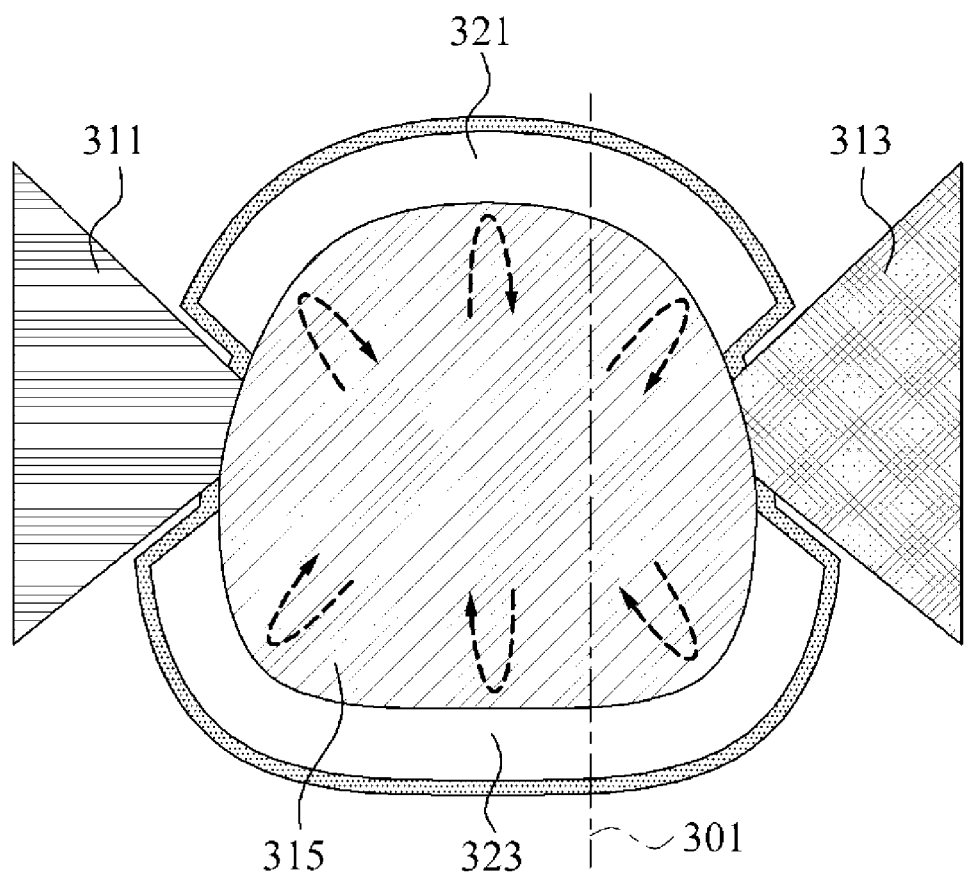

BULK ACOUSTIC WAVE RESONATOR

CROSS-REFERENCE TO RELATED APPLICATION(S)

This application is a continuation of U.S. patent application Ser. No. 13/691,114 filed on Nov. 30, 2012, which claims the benefit under 35 U.S.C. §119(a) of Korean Patent Application No. 10-2011-0127686, filed on Dec. 1, 2011, in the Korean Intellectual Property Office, the entire disclosure of which is incorporated herein by reference for all purposes.

BACKGROUND

1. Field

The following description relates to a bulk acoustic wave resonator (BAWR).

2. Description of Related Art

A bulk acoustic wave resonator (BAWR) operates by the application of an electric potential to electrodes that are disposed on and/or below a piezoelectric layer. The piezoelectric layer oscillates in response to a high frequency electric potential applied to the electrodes. As a result, the BAWR operates.

Bandwidth of the BAWR is proportional to an Acousto-electric coupling coefficient. A film characteristic of the electrodes and the piezoelectric layer affect the Acousto-electric coupling coefficient. Therefore, to increase the bandwidth of the BAWR, it is necessary to increase a value of the Acousto-electric coupling coefficient.

Accordingly, it is necessary to continuously develop technologies that improve bandwidth using the film characteristic of the electrodes and the piezoelectric layer.

SUMMARY

In one general aspect, there is provided a bulk acoustic wave resonator (BAWR), including a bulk acoustic wave resonance unit including a first electrode, a second electrode, and a piezoelectric layer disposed between the first electrode and the second electrode, and an air edge formed at a predetermined distance from a center of the bulk acoustic wave resonance unit.

The air edge may be formed by etching a predetermined portion of an edge of the bulk acoustic wave resonance unit about as thick as the bulk acoustic wave resonance unit in a vertical direction.

The BAWR may further include an air gap, disposed below the bulk acoustic wave resonance unit and on a substrate that reflects a vertical acoustic wave generated from the bulk acoustic wave resonance unit.

The air edge may be formed by penetrating a predetermined portion of an edge of the bulk acoustic wave resonance unit up to the air gap in a vertical direction.

The air edge may be formed by enlarging a via-hole disposed on the bulk acoustic wave resonance unit.

The first electrode, the second electrode, and the piezoelectric layer may be etched in the same process by application of a photo-mask layered on a portion different from an edge of the bulk acoustic wave resonance unit so that the air edge may have a steep slope.

The air edge may be formed on a portion of an edge of the bulk acoustic wave resonance unit, the portion being greater than or equal to 20% of the edge.

The BAWR may further include a bridge, disposed on a predetermined area excluding a portion where the air edge is formed in an edge of the bulk acoustic wave resonance unit, that supports the bulk acoustic wave resonance unit.

The BAWR may further include a passivation layer, formed of one of a silicon oxide-based material, a silicon nitride-based material, and an aluminum nitride (AlN)-based material, disposed on or below the piezoelectric layer.

The BAWR may further include a passivation layer, formed of one of a silicon oxide-based material, a silicon nitride-based material, and an AlN-based material, disposed on or below the first electrode.

The BAWR may further include a passivation layer, formed of one of a silicon oxide-based material, a silicon nitride-based material, and an AlN-based material, disposed on or below the second electrode. The bulk acoustic wave resonance unit may include a first frame formed by locally forming, though evaporation, an additional film at a portion that is connected to the first electrode and excludes the air edge on an edge of the bulk acoustic wave resonance unit, and a second frame formed by locally forming, through evaporation, an additional film at a portion that is connected to the second electrode and excludes the air edge on the edge of the bulk acoustic wave resonance unit.

The bulk acoustic wave resonance unit may include a first frame formed, though local etching, at a portion that is connected to the first electrode and excludes the air edge on an edge of the bulk acoustic wave resonance unit, and a second frame formed, through local etching, at a portion that is connected to the second electrode and excludes the air edge on the edge of the bulk acoustic wave resonance unit.

The first electrode may include a portion connected to a predetermined portion of an edge of the bulk acoustic wave resonance unit, in a form of a finger, and a portion exposed to the air edge through patterning.

The second electrode may include a portion connected to a predetermined portion of an edge of the bulk acoustic wave resonance unit, in a form of a finger, and a portion exposed to the air edge through patterning.

The bulk acoustic wave resonance unit may include a first frame formed by locally forming, through evaporation, an additional film at a portion where the first electrode is connected, in a form of a finger, to a predetermined portion of an edge of the bulk acoustic wave resonance unit, and a second frame formed by locally forming, through evaporation, an additional film at a portion where the second electrode is connected, in a form of a finger, to a predetermined portion of the edge of the bulk acoustic wave resonance unit.

The bulk acoustic wave resonance unit may include a first frame formed, through local etching, at a portion where the first electrode is connected, in a form of a finger, to a predetermined portion of an edge of the bulk acoustic wave resonance unit, and a second frame formed, through local etching, at a portion where the second electrode is connected, in a form of a finger, to a predetermined portion of the edge of the bulk acoustic wave resonance unit.

In another general aspect, there is provided a BAWR, including a substrate, an air gap disposed on a predetermined area of the substrate, a first electrode disposed on the air gap, a piezoelectric layer disposed on the first electrode, a second electrode disposed on the piezoelectric layer, and an air edge formed at a predetermined distance from a center of the air gap.

The air edge may be formed by etching a predetermined portion of an edge of a portion where the first electrode, the piezoelectric layer, and the second electrode are layered as thick as the first electrode, the piezoelectric layer, and the second electrode in a vertical direction.

In yet another general aspect, a method of manufacturing a bulk acoustic wave resonance unit includes the steps of: forming a first electrode; forming a second electrode; forming a piezoelectric layer between the first and the second electrode; and forming an air edge at a predetermined distance from a center of the bulk acoustic wave resonance unit.

The air edge is formed by etching a predetermined portion of an edge of the bulk acoustic wave resonance unit about as thick as the bulk acoustic wave resonance unit in a vertical direction.

The air edge is formed by penetrating a predetermined portion of an edge of the bulk acoustic wave resonance unit in a vertical direction.

The air edge is formed by enlarging a via-hole disposed on the bulk acoustic wave resonance unit.

An illustrative example provides a BAWR that uses an air edge to reduce loss due to a horizontal acoustic wave and thus, may improve an Acousto-electric coupling coefficient.

An illustrative example provides a BAWR that uses an air edge to reduce loss due to a horizontal acoustic wave and thus, the BAWR may have a high Q-factor value.

An illustrative example may secure a high Acousto-electric coupling coefficient using a BAWR and thus, may embody an RF filter or an RF duplexer having a wide bandwidth.

An illustrative example embodies an RF duplexer having a narrow band gap using a BAWR.

An illustrative example provides a BAWR that operates as a reference resonator of an oscillator and thus, may remove phase noise.

Companies operating a mobile communication system, for example, a portable phone, suffer huge costs for the allocation of frequencies to be used for communication because of the limited number of frequency resources.

To prevent interference from occurring among transmitted and received signals, a predetermined band gap is needed between a transmission frequency and reception frequency of a terminal.

Thus, companies have tried to reduce the band gap between the transmission frequency and the reception frequency in order to effectively utilize the allocated frequencies.

In addition, the BAWR may be used for input and output of wireless data as a filter, a transmitter, a receiver, or a duplexer in a wireless communication device.

There are various types of wireless communication devices for various purposes, and the number of wireless devices, conventionally regarded as wired devices, has increased rapidly.

Thus, a number of fields to which the BAWR may be applied has expanded.

Other features and aspects may be apparent from the following detailed description, the drawings, and the claims.

BRIEF DESCRIPTION OF THE DRAWINGS

FIGS. 3A and 3B are diagrams illustrating a top view and a cross-sectional view of a BAWR in accordance with an illustrative example.

Figure 1:
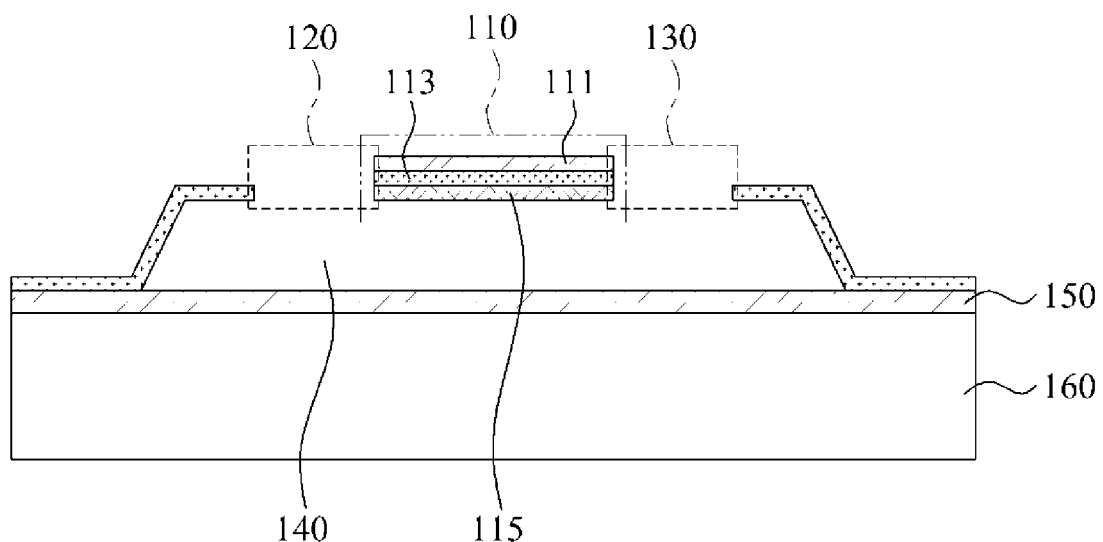
FIG. 1 is a diagram illustrating a cross-sectional view of a bulk acoustic wave resonator (BAWR) in accordance with an illustrative example.

Throughout the drawings and the detailed description, unless otherwise described, the same drawing reference numerals will be understood to refer to the same elements, features, and structures. The relative size and depiction of these elements may be exaggerated for clarity, illustration, and convenience.

DETAILED DESCRIPTION

The following detailed description is provided to assist the reader in gaining a comprehensive understanding of the methods, apparatuses and/or systems described herein. Accordingly, various changes, modifications, and equivalents of the systems, apparatuses and/or methods described herein will be suggested to those of ordinary skill in the art. The sequence(s) of processing steps and/or operations described are examples; however, the sequence of and/or operations are not limited to that which is set forth herein and may be changed as is appreciated by those of ordinary skill in the art, with the exception of steps and/or operations necessarily occurring in a certain order. Also, descriptions of well-known features and operations are omitted for increased clarity and conciseness.

A resonator having a high Q value is required to reduce the band gap in a radio frequency (RF) communication system. Furthermore bandwidth needs to be increased to satisfy amount and rate of data transmission which are gradually increasing.

A bulk acoustic wave resonator (BAWR) is a device that induces a resonance using a vertical acoustic wave to electrically utilize the resonance. The BAWR uses an air gap structure as a reflector to minimize the loss of the vertical acoustic wave, or the BAWR uses a reflector structure corresponding to a plurality of alternately evaporated reflection films.

However, because of film characteristics of a film included in the BAWR, a horizontal acoustic wave might also exist in addition to a vertical acoustic wave. When the horizontal acoustic wave is transferred to an external side of the BAWR, the loss of the horizontal acoustic wave could occur and the Q value of the BAWR could decrease.

The BAWR may be raised commensurate with a thickness of an air gap, above a substrate through the air gap to improve a reflection characteristic of an acoustic wave. When the BAWR has a frequency band-pass characteristic, a plurality of resonators are disposed on a plane and the resonators may be connected to a common electrode, to improve a reflection characteristic or transmission characteristic within a frequency band range.

An Acousto-electric coupling coefficient is proportional to a band gap between a resonant frequency and an anti-resonant frequency. Accordingly, a value of the Acousto-electric coupling coefficient may be increased by changing the resonant frequency or the anti-resonant frequency. The BAWR may adjust the band gap between the resonant frequency and the anti-resonant frequency by reflecting a horizontal acoustic wave using an air edge.

Thus, the BAWR may reflect a horizontal acoustic wave using an air edge, may increase a value of an Acousto-electric coupling coefficient, and may increase bandwidth.

FIG. 1 illustrates a cross-sectional view of an example of a BAWR in accordance with an illustrative example.

Referring to FIG. 1, the BAWR includes a bulk acoustic wave resonance unit 110, an air edge 120, and an air edge 130.

The bulk acoustic wave resonance unit 110 includes a first electrode 115, a piezoelectric layer 113, and a second electrode 111. The piezoelectric layer 113 is disposed between the first electrode 115 and the second electrode 111. The first electrode 115 or the second electrode 111 is formed of a material, for example, molybdenum (Mo), ruthenium (Ru), aluminum (Al), platinum (Pt), titanium (Ti), tungsten (W), palladium (Pd), chromium (Cr), nickel (Ni), and other suitable materials.

The bulk acoustic wave resonance unit 110 generates a resonant frequency and an anti-resonant frequency through the piezoelectric layer 113, based on a signal applied to the first electrode 115 and the second electrode 111.

The bulk acoustic wave resonance unit 110 uses an acoustic wave generated from a piezoelectric material. When an RF signal is applied to the piezoelectric material, mechanical oscillations occur and an acoustic wave is generated. Examples of the piezoelectric material may include zinc oxide (ZnO), aluminum nitride (AlN), and other suitable materials.

Resonance occurs when half of a wavelength of the applied RF signal is equal to a thickness of a piezoelectric film. When resonance occurs, an electrical impedance of the BAWR is sharply changed and thus, the BAWR may be utilized as a filter to select a frequency.

A resonant frequency may be determined based on a thickness of a piezoelectric film, an electrode surrounding the piezoelectric film, and an intrinsic acoustic wave speed of the piezoelectric film, by way of non-limiting example. For example, resonant frequency may increase as the thickness of the piezoelectric film decreases.

The resonant frequency may be a frequency occurring when a response to an applied signal is greatest. Impedance of the BAWR at the resonant frequency is thus minimal. The anti-resonant frequency may be a frequency occurring when a response to an applied signal is lowest. Impedance of the BAWR at the anti-resonant frequency is thus maximal.

The bulk acoustic wave resonance unit 110 may be disposed on an air gap 140. A reflection characteristic of a vertical acoustic wave generated from the bulk acoustic wave resonance unit 110 may be improved through the inclusion of the air gap 140. The air gap 140 may be formed inside a substrate 160, through etching, or may be formed on the substrate 160 using a sacrificial layer (not shown) patterned to correspond to a shape of the air gap 140.

The substrate 160 may be formed of silicon or polysilicon having a high resistance, by way of non-limiting example. A passivation layer 150 may be layered on the substrate 160 to prevent damage to the substrate 160 during a process of generating the air gap 140. The passivation layer 150 may be formed of one of a silicon oxide-based material, a silicon nitride-based material, and an aluminum nitride-based material.

The air edge 120 and the air edge 130 may be formed at a predetermined distance from a center of the bulk acoustic wave resonance unit 110. The air edge 120 and the air edge 130 may be formed at a predetermined distance from a center of the air gap 140.

The air edge 120 and the air edge 130 may be formed by enlarging via-holes (not shown) used for forming the air gap 140. The air gap 140 may be formed by removing the sacrificial layer using xenon difluoride ($XeF_2$) gas or other suitable materials injected through the via-hole. The via-hole may be formed on a predetermined area of the bulk acoustic wave resonance unit 110.

A vertical acoustic wave generated from the bulk acoustic wave resonance unit 110 may be reflected by the air gap 140 to prevent loss due to a horizontal acoustic wave and or a vertical acoustic wave in the substrate 160 and thus, may remain in the bulk acoustic wave resonance unit 110. A horizontal acoustic wave generated from the bulk acoustic wave resonance unit 110 may be reflected by the air edge 120 and the air edge 130 to prevent loss due to a horizontal acoustic wave and or a vertical acoustic wave in the piezoelectric layer 113 and thus, may remain in the bulk acoustic wave resonance unit 110.

Since loss in the vertical acoustic wave and the horizontal acoustic wave does not occur, the BAWR may have a high Q value, a high Acousto-electric coupling coefficient, and an increased bandwidth.

The air edge 120, the air edge 130, and the air gap 140 may be empty spaces, and thus may have substantially infinite impedance. Since the impedance of the air edge 120, the air edge 130, and the air gap 140 are substantially infinite, an acoustic wave generated from the bulk acoustic wave resonance unit 110 may be reflected by a boundary surface of the air edge 120, the air edge 130, and the air gap 140, as opposed to being transferred to the air edge 120, the air edge 130, and the air gap 140.

The air edge 120 and the air edge 130 may be formed by etching a predetermined portion of an edge of the bulk acoustic wave resonance unit 110 as thick as the bulk acoustic wave resonance unit 110 in a vertical direction. The air edge 120 and the air edge 130 may be formed by etching a predetermined portion of an existing portion formed to be the bulk acoustic wave resonance unit 110.

The air edge 120 and the air edge 130 are formed by penetrating a predetermined portion of the edge of the bulk acoustic wave resonance unit 110. The air edge 120 and the air edge 130 may be connected to the air gap 140 to form an empty space.

The air edge 120 and the air edge 130 may be formed by layering a photo-mask on a portion different from the edge of the bulk acoustic wave resonance unit 110 and performing etching. Since a portion where the photo-mask is not layered is etched and thus, the first electrode 115, the piezoelectric layer 113, and the second electrode 111 are etched in the same process at a given time and thus, steep slopes of the air edge 120 and the air edge 130 may be formed. Preferably, a steep slope of 90 degrees may be formed.

The air edge 120 and the air edge 130 may be formed by etching a predetermined portion of an edge of a portion where the first electrode 115, the piezoelectric layer 113, and the second electrode 111 are layered, as thick as the first electrode 115, the piezoelectric layer 113, and the second electrode 111, in a vertical direction.

The edge of the bulk acoustic wave resonance unit 110 may be an area where a slope is formed on the bulk acoustic wave resonance unit 110. For example, the edge may correspond to a portion of the second electrode 111 having a different height as opposed to other portions of the second electrode 111, and an area where a slope begins.

The air edge 120 and the air edge 130 may be formed on a portion of the edge of the bulk acoustic wave resonance unit 110, preferably the portion being greater than or about equal to 20% of the edge.

The passivation layer 150 may be disposed on the substrate 160, and may be disposed on or below the piezoelectric layer 113. The passivation layer 150 may be disposed on or below the first electrode 115. The passivation layer 150 may be disposed on or below the second electrode 111.

Figure 2:
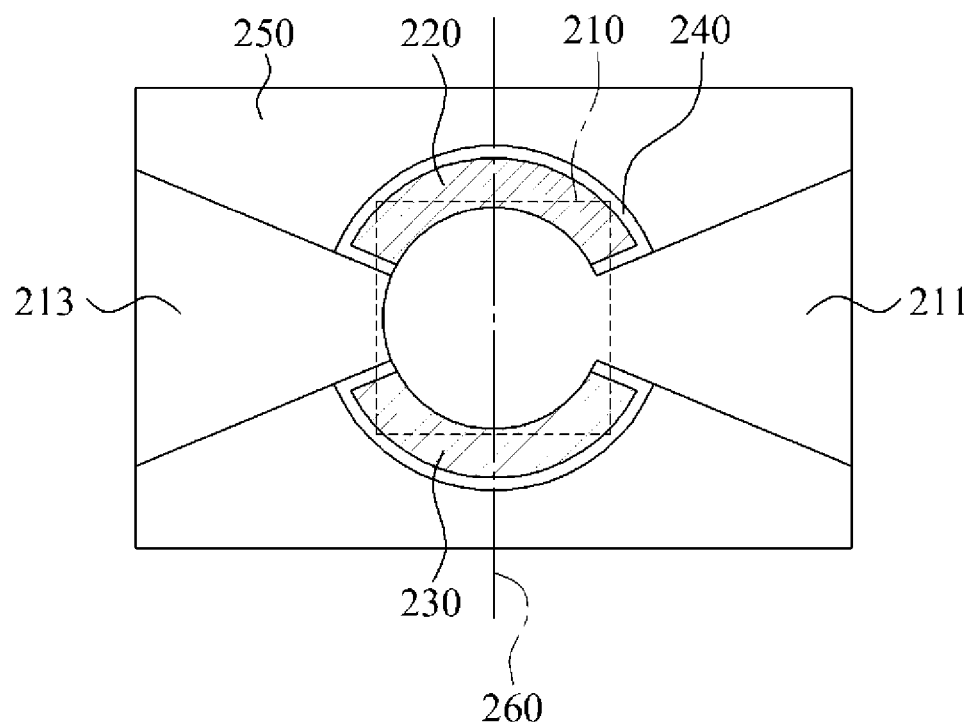
FIG. 2 is a diagram illustrating a top view a BAWR in accordance with an illustrative example.

FIG. 2 illustrates a top view of an example of a BAWR in accordance with an illustrative example.

The BAWR of FIG. 2 is a top view of the BAWR of FIG. 1. The BAWR of FIG. 1 is the cross-sectional view of the BAWR cut along a line 260.

The bulk acoustic wave resonance unit 210 includes a first electrode 213, a second electrode 211, and a piezoelectric layer 240 between the first electrode 213 and the second electrode 211.

An air edge 220 and an air edge 230 may be formed on a portion preferably greater than or equal to 20% of an edge of the bulk acoustic wave resonance unit 210. Referring to FIG. 2, the air edge 220 and the air edge 230 may occupy about 60% of the edge. The air edge 220 and the air edge 230 may be formed on a portion excluding, from the edge, a portion where the first electrode 213 is connected and a portion where the second electrode 211 is connected.

An air gap may be disposed below the air edge 220, the air edge 230, and the bulk acoustic wave resonance unit 210. The air gap may be disposed on a substrate 250.

A vertical acoustic wave generated in a direction from the second electrode 211 to the first electrode 213 may be reflected using the air gap as a reflector. A horizontal acoustic wave generated from the first electrode 213 and the second electrode 211 may be reflected using the air edge 220 and the air edge 230 as reflectors.

Figure 3B:
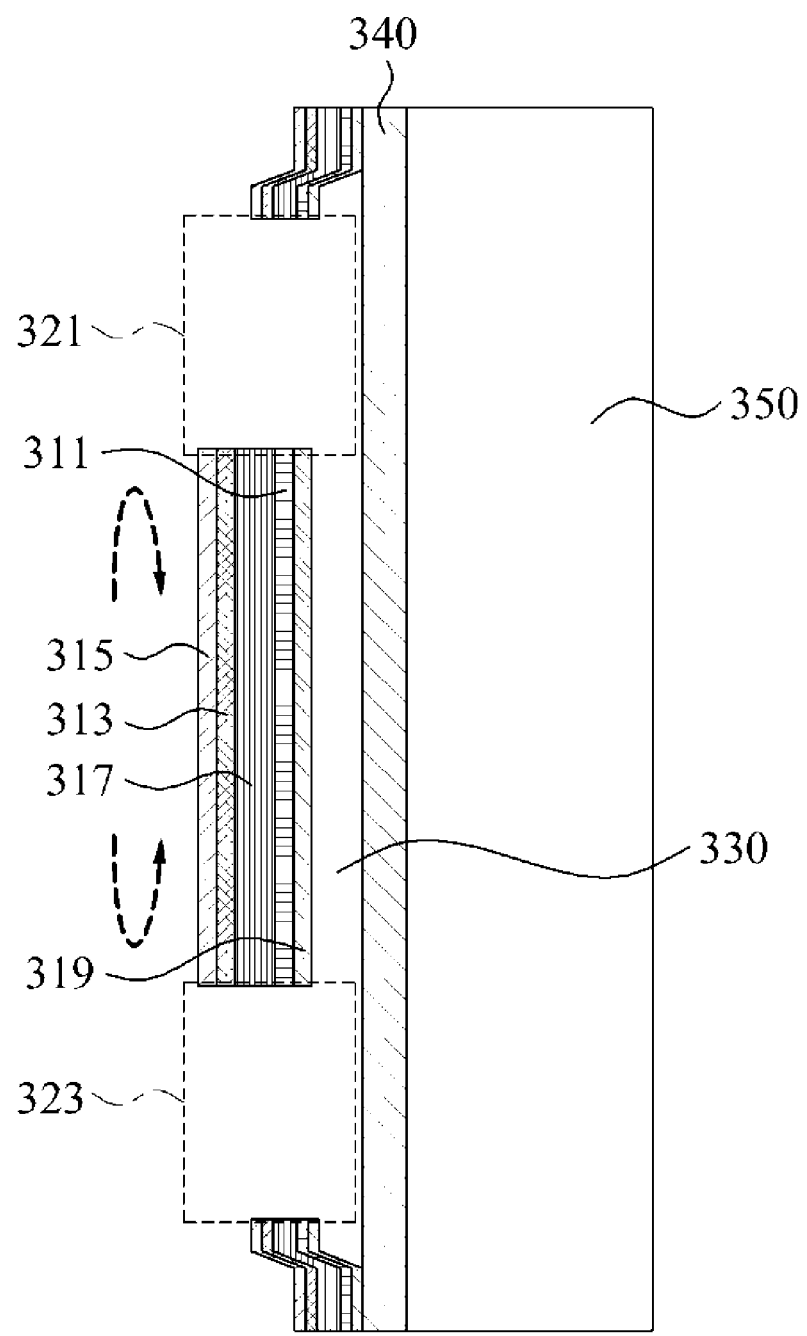

FIGS. 3A and 3B illustrate a top view and a sectional view of another example of a BAWR in accordance with an illustrative example.

FIG. 3A illustrates the top view of the BAWR, and FIG. 3B illustrates the sectional view of the BAWR cut along a line 301.

Referring to FIG. 3A, the BAWR includes a first electrode 311, a second electrode 313, a protective layer 315, a piezoelectric layer (not shown) disposed between the first electrode 311 and the second electrode 313, an air edge 321, and an air edge 323.

Dotted arrows in the protective layer 315 indicate that a horizontal acoustic wave generated from the BAWR is reflected through application of the air edge 321 and the air edge 323 as reflectors.

By way of non-limiting example, an air gap may be disposed below the first electrode 311. In this non-limiting example, a membrane (not shown) may be layered on the air gap to maintain a shape of the air gap. The air gap may be disposed on a substrate. In this non-limiting example, a protective layer (not shown) may be layered on the substrate to prevent the substrate from being damaged during a process of generating the air gap. The protective layer may be referred to as a passivation layer.

The air edge 321 and the air edge 323 may be generated by enlarging via-holes (not shown). The air edge 321 and the air edge 323 may be formed by etching a portion of an edge of the BAWR.

The air edge 321 and the air edge 323 may be formed by penetrating an edge of a portion where the protective layer 315, the second electrode 313, the piezoelectric layer (not shown), and the first electrode 311, up to the air gap in vertical direction.

Referring to FIG. 3B, the BAWR includes the first electrode 311, a piezoelectric layer 317, the second electrode 313, the protective layer 315, a membrane 319, an air gap 330, the air edge 321, the air edge 323, a protective layer 340, and a substrate 350.

An RF signal may be input to the first electrode 311, and an RF signal may be output from the second electrode 313. Conversely, an RF signal may be input to the second electrode 313, and an RF signal may be output from the first electrode 311.

The protective layer 315 may protect the second electrode 313 from being exposed to an external side. Exposing the second electrode 313 to an external side may refer to being exposed to air, humidity, or environmental temperature or other factors.

The membrane 319 may be used to maintain a shape of the air gap 330. The protective layer 340 may be used to prevent the substrate 350 from being damaged during a process of generating the air gap 330. The protective layer 340 may be formed of one of silicon oxide-based material, a silicon nitride-based material, and an aluminum nitride-based material or other suitable materials.

The air edge 321 and the air edge 323 may be formed by etching an edge of a portion where the first electrode 311, the piezoelectric layer 317, the second electrode 313, the protective layer 315, and the membrane 319 are layered. Also, the air edge 321 and the air edge 323 may be formed by enlarging via-holes (not shown) to be used for generating the air gap 330.

A horizontal acoustic wave generated from the first electrode 311, the piezoelectric layer 317, and the second electrode 313 may be reflected through application of the air edge 321 and the air edge 323 as reflectors.

Figure 4A:
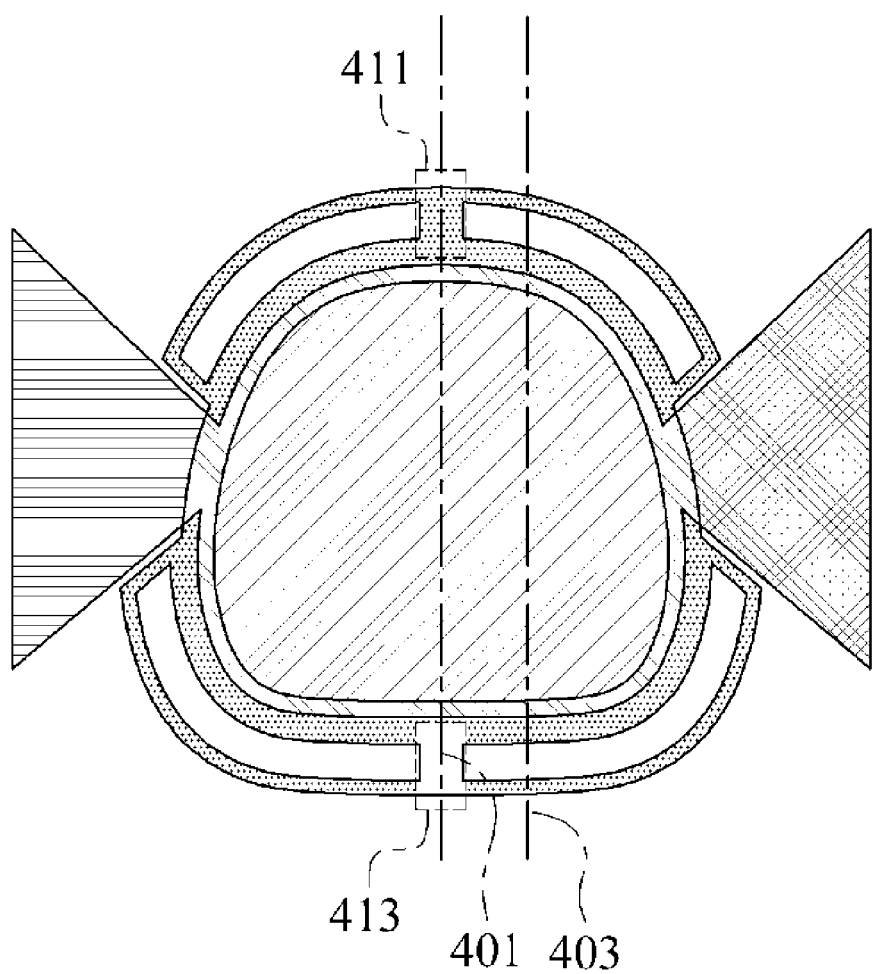
FIGS. 4A through 4C are diagrams illustrating a top view and cross-sectional views of a BAWR in accordance with an illustrative example.
Figure 4B:
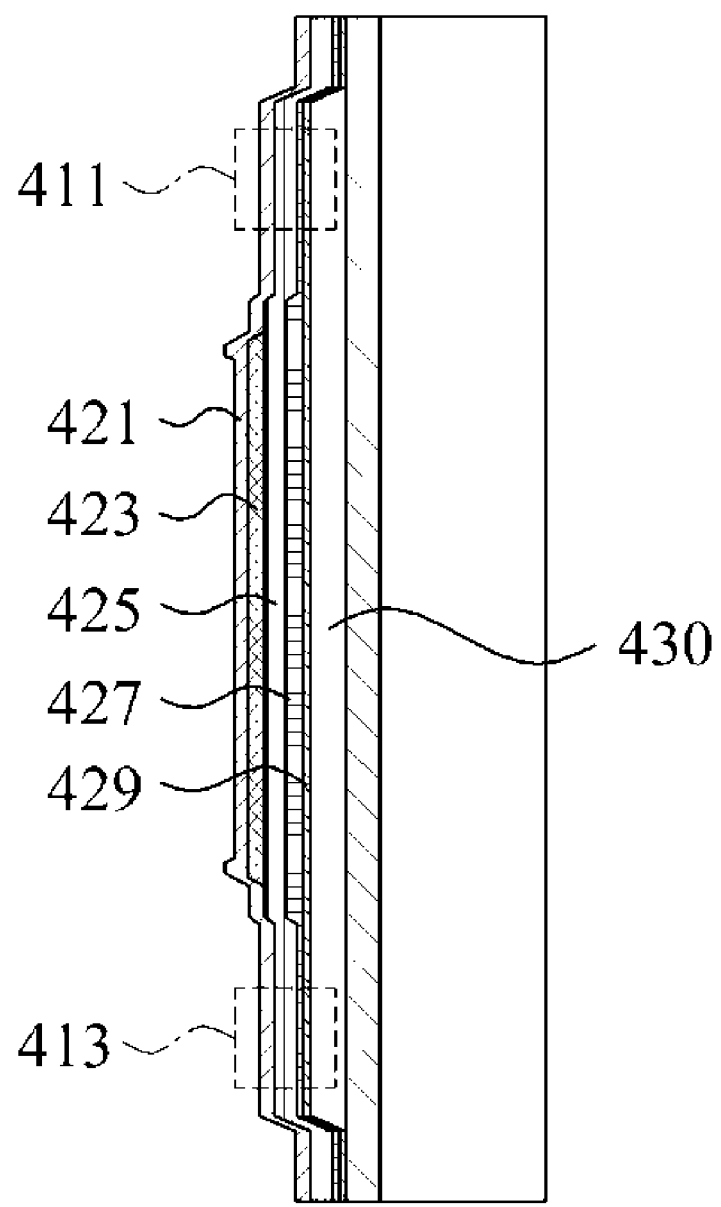
Figure 4C:
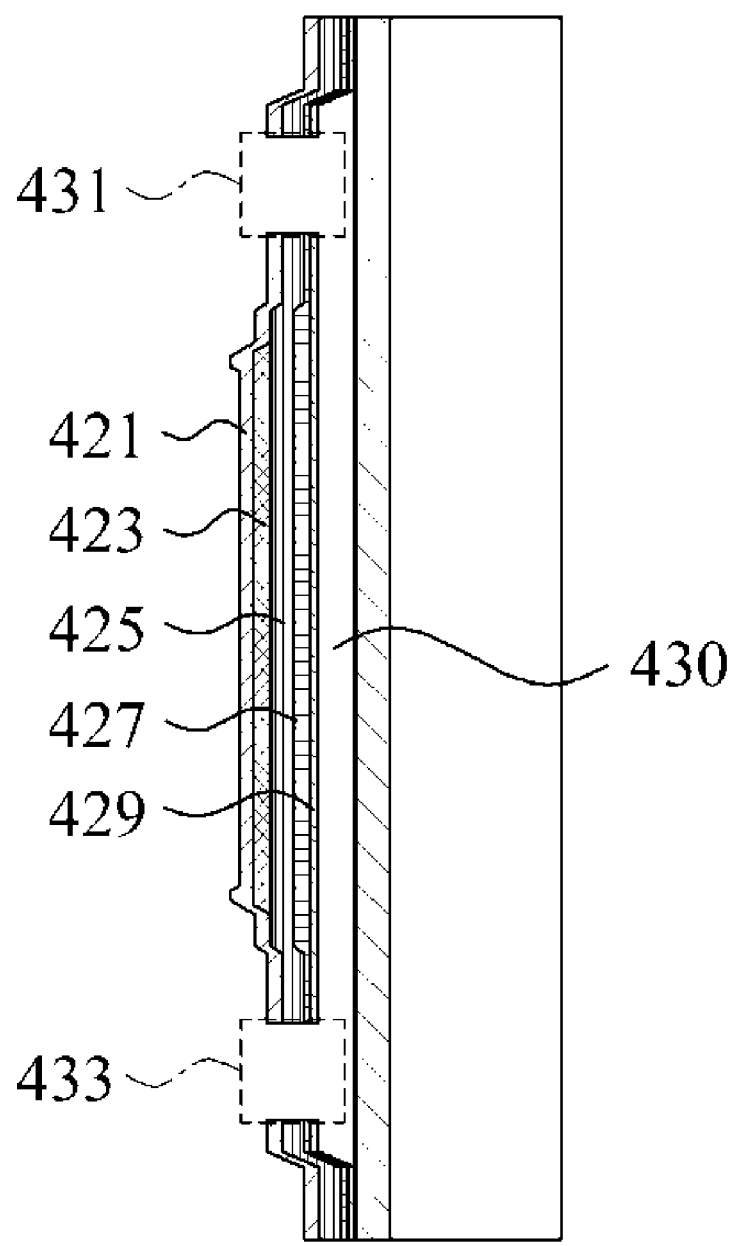

FIGS. 4A through 4C illustrate a top view and sectional views in accordance with an illustrative example of a BAWR.

FIG. 4A is the top view of the BAWR including a bridge structure. FIG. 4B is the sectional view of the BAWR cut along a line 401. FIG. 4C is the sectional view of the BAWR cut along a line 403.

Referring to FIG. 4A, the BAWR includes a bridge 411 and a bridge 413. The bridge 411 and the bridge 413 correspond to portions where an air edge is not formed in an edge of the BAWR. A bridge indicates a portion that is not etched in the edge of the BAWR. The structure of the BAWR may be stably maintained through the bridge 411 and the bridge 413.

The bridge 411 and the bridge 413 may be disposed between air edges, respectively, on each side, to maintain shapes of the air edges.

Referring to FIG. 4B, the BAWR includes a protective layer 421, a second electrode 423, a piezoelectric layer 425, a first electrode 427, a membrane 429, an air gap 430, the bridge 411 and the bridge 413. The bridge 411 and the bridge 413 may not be etched and support the protective layer 421, the second electrode 423, the piezoelectric layer 425, the first electrode 427, and the membrane 429 for the stability of a physical structure.

Referring to FIG. 4C, the BAWR includes the protective layer 421, the second electrode 423, the piezoelectric layer 425, the first electrode 427, the membrane 429, and the air gap 430, an air edge 431, and an air edge 433.

Figure 5:
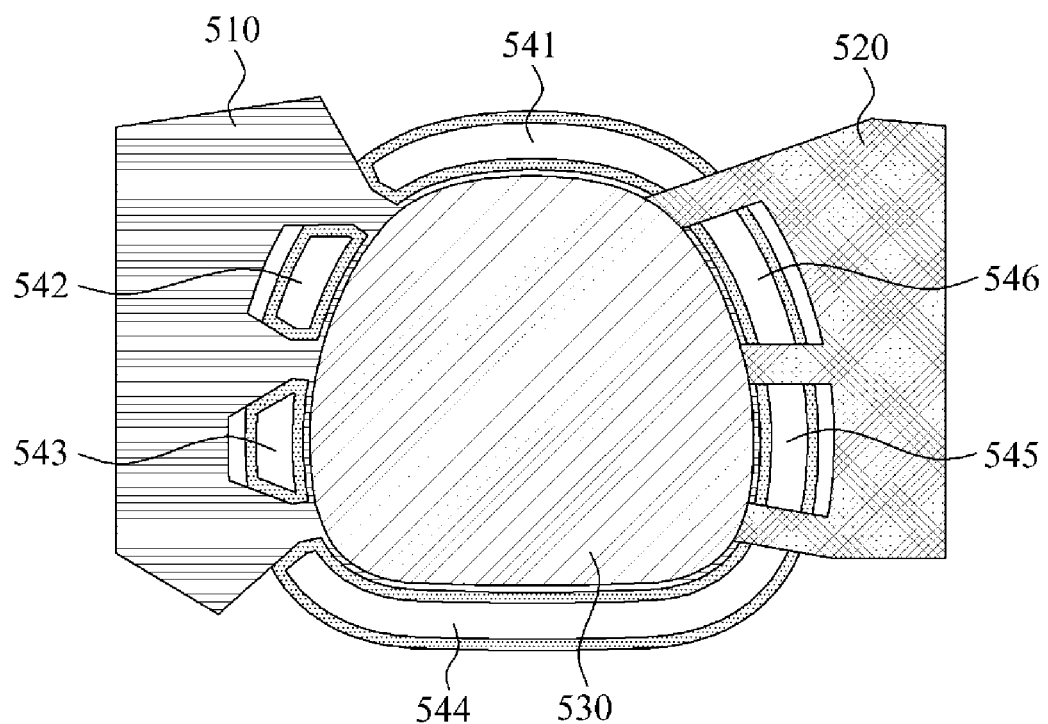
FIG. 5 is a diagram illustrating a top view of a BAWR in accordance with an illustrative example.

FIG. 5 illustrates a top view of in accordance with an illustrative example of a BAWR.

FIG. 5 illustrates the BAWR including an electrode in the form of a finger. The BAWR includes a first electrode 510, a second electrode 520, a piezoelectric layer disposed between the first electrode 510 and the second electrode 520, a protective layer 530, an air edge 541, an air edge 542, an air edge 543, an air edge 544, an air edge 545, and an air edge 546.

In this illustrative example, a predetermined portion patterned in the form of a finger included in the first electrode 510 may be etched. In this illustrative example, the air edge 542 and the air edge 543 may be formed on the etched predetermined portion.

Resistance is proportional to area. As an area of an electrode decreases, a resistance of the electrode may decrease. Reflectivity is proportional to area. As an area of an air edge increases, a reflectivity of a horizontal acoustic wave may increase.

Although the first electrode 510 includes three fingers in FIG. 5, the first electrode 510 may be configured to include a plurality of fingers. Here, the form of the finger describes that a predetermined area of the first electrode 510 is etched to be divided into a plurality of portions, and a shape of the first electrode 510 divided into the plurality of portions may not be limited thereto.

A predetermined portion patterned in the form of a finger included in the second electrode 520 may be etched. The air edge 545 and the air edge 546 may be formed on the etched predetermined portion.

Although the second electrode 520 includes three fingers in FIG. 5, the second electrode 520 may be configured to include a plurality of fingers. In this illustrative example, the form of the finger describes that a predetermined area of the second electrode 520 is etched to be divided into a plurality of portions, and a shape of the second electrode 520 divided into the plurality of portions may not be limited thereto.

An additional film (not shown) may be locally formed, through evaporation, at a portion where the first electrode 510 and the protective layer 530 are in contact and thus, a frame may be formed. In this illustrative example, the additional film may be formed of the same material as a material included in the protective layer 530. Further, the frame may be formed of a plurality of pieces of frames.

Also, an additional film (not shown) may be locally formed, through evaporation, at a portion where the second electrode 520 and the protective layer 530 are in contact and thus, a frame may be formed. In this illustrative example, the additional film may be formed of the same material as a material included in the protective layer 530.

A change in impedance may occur at a position where the frame is formed when the frame is additionally formed on the protective layer 530. The impedance of the BAWR may be determined based on the thickness of layered films. Impedance may vary due to the change in thickness of the layered films.

A horizontal acoustic wave generated from the first electrode 510 and the second electrode 530 may be reflected using a surface where the frame is formed as a reflector based on a difference in impedance.

Furthermore, a U-shaped frame may be formed at a portion where the first electrode 510 and the protective layer 530 are in contact by locally etching the protective layer 530.

Furthermore, a U-shaped frame may be formed at a portion where the second electrode 520 and the protective layer 530 are in contact by locally etching the protective layer 530.

Figure 6A:
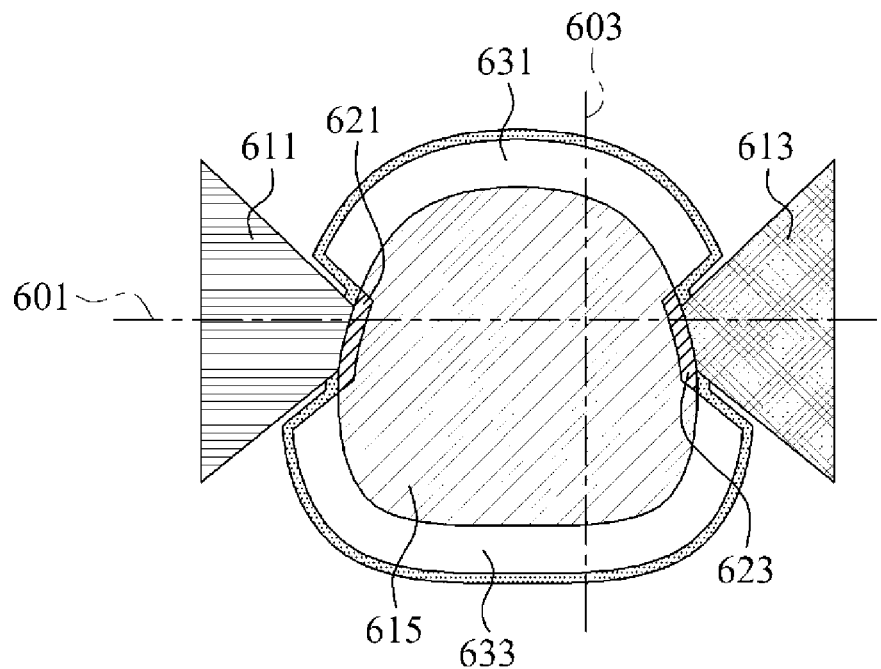
FIGS. 6A through 6C are diagrams illustrating a top view and sectional views of a BAWR in accordance with an illustrative example.
Figure 6B:
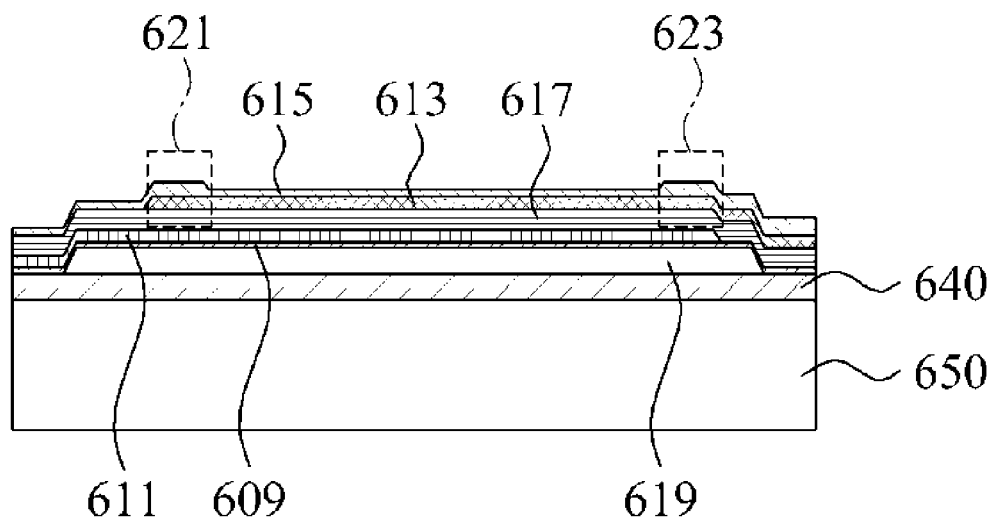
Figure 6C:
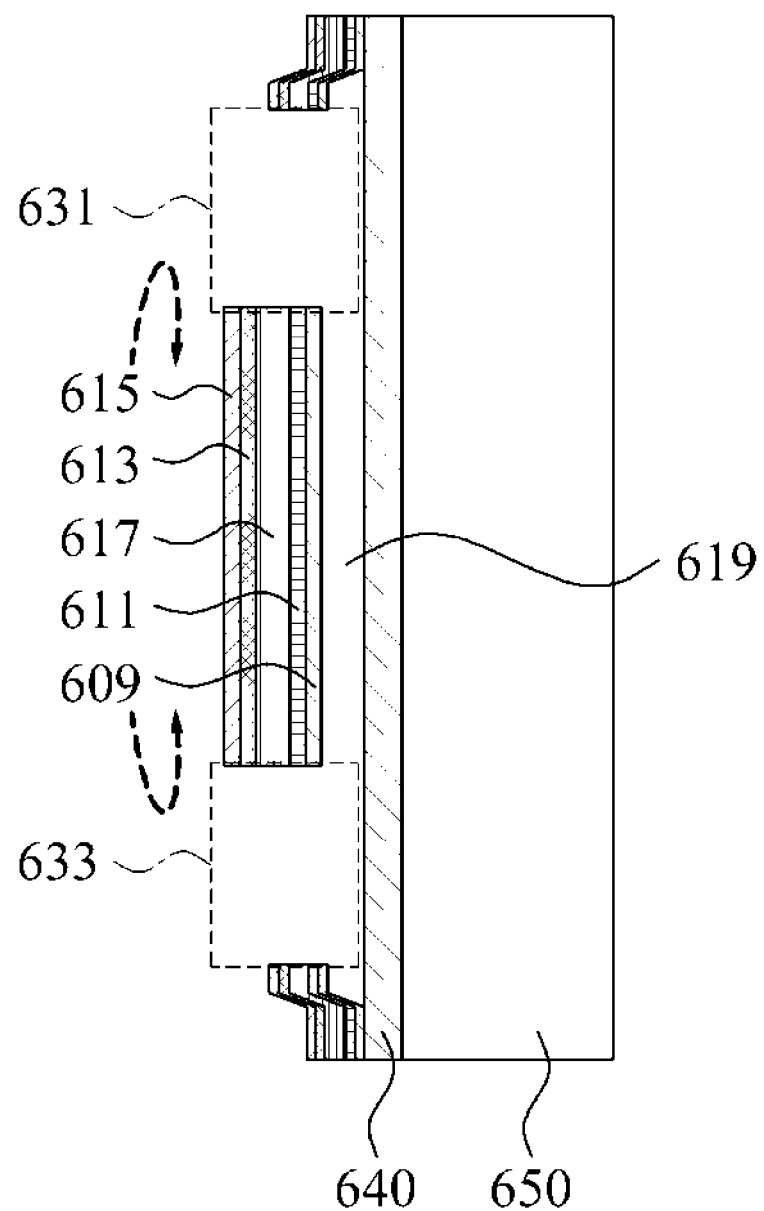

FIGS. 6A through 6C illustrate a top view and sectional views in accordance with an illustrative example of a BAWR.

FIG. 6A is the top view of the BAWR when a frame is added. FIG. 6B is the sectional view of the BAWR cut along a line 601. FIG. 6C is the sectional view of the BAWR cut along a line 603.

Referring to FIG. 6A, the BAWR includes a first electrode 611, a second electrode 613, and a protective layer 615, a piezoelectric layer (not shown) disposed between the first electrode 611 and the second electrode 613, a frame 621, a frame 623, an air edge 631, and an air edge 633.

The frame 621 may be formed by locally forming, through evaporation, an additional film at a portion where the first electrode 611 and the protective layer 615 are in contact. In this illustrative example, the additional film may be formed of the same material as a material included in the protective layer 615. Further, the frame 621 may be formed of a plurality of pieces of frames.

The frame 623 may be formed by locally forming, through evaporation, an additional film at a portion where the second electrode 613 and the protective layer 615 are in contact. In this illustrative example, the additional film may be formed of the same material as a material included in the protective layer 615. Further, the frame 623 may be formed of a plurality of pieces of frames.

A horizontal acoustic wave generated from the first electrode 611 and the second electrode 613 may be reflected using a surface where the frame 621 is formed and a surface where the frame 623 is formed, as reflectors based on different impedances.

Referring to FIG. 6B, the BAWR includes the first electrode 611, a piezoelectric layer 617, the second electrode 613, the protective layer 615, the frame 621, the frame 623, a membrane 609, an air gap 619, a protective layer 640, and a substrate 650.

A thickness of the frame 621 and a thickness of the frame 623 are different from the thicknesses of remaining portions of the frames. Accordingly, a horizontal acoustic wave generated from the first electrode 611 and the second electrode 613 may be reflected using a surface where the frame 621 is formed and a surface where the frame 623 is formed, as reflectors based on a difference in impedances.

Referring to FIG. 6C, the BAWR includes the first electrode 611, the piezoelectric layer 617, the second electrode 613, the protective layer 615, an air edge 631, an air edge 633, the membrane 609, the air gap 619, and the protective layer 640, and the substrate 650.

The air edge 631 and the air edge 633 may be empty spaces and may have an infinite value of impedance. A horizontal acoustic wave generated from the first electrode 611 and the second electrode 613 may be reflected using a surface where the air edge 631 is formed and a surface where the air edge 633 is formed, as reflectors based on a difference in impedances.

Figure 7A:
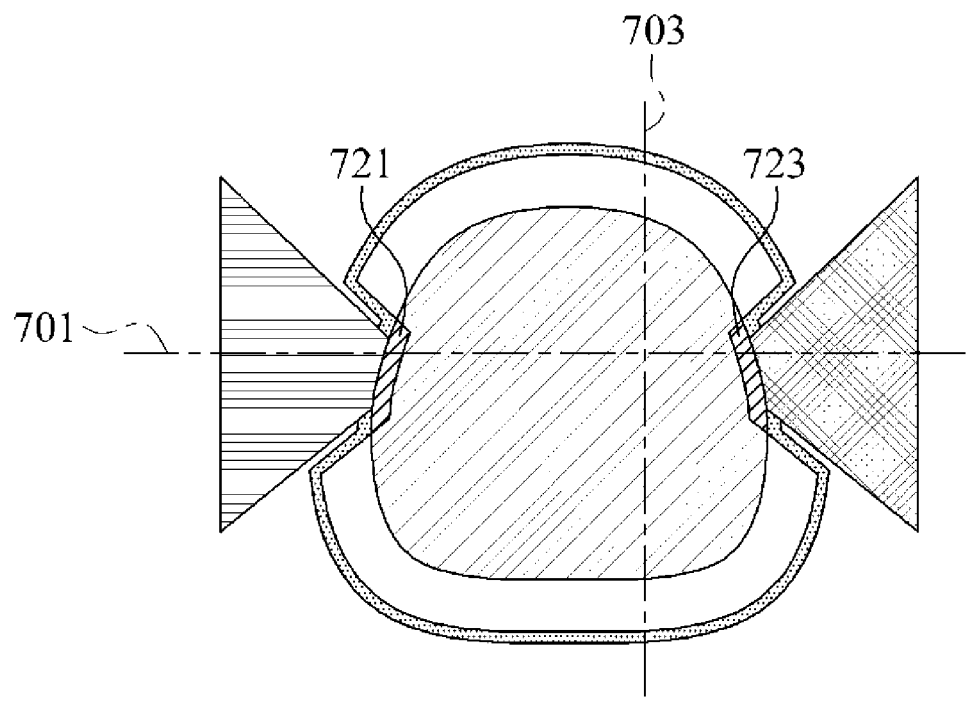
FIGS. 7A through 7C are diagrams illustrating a top view and sectional views of a BAWR in accordance with an illustrative example.
Figure 7B:
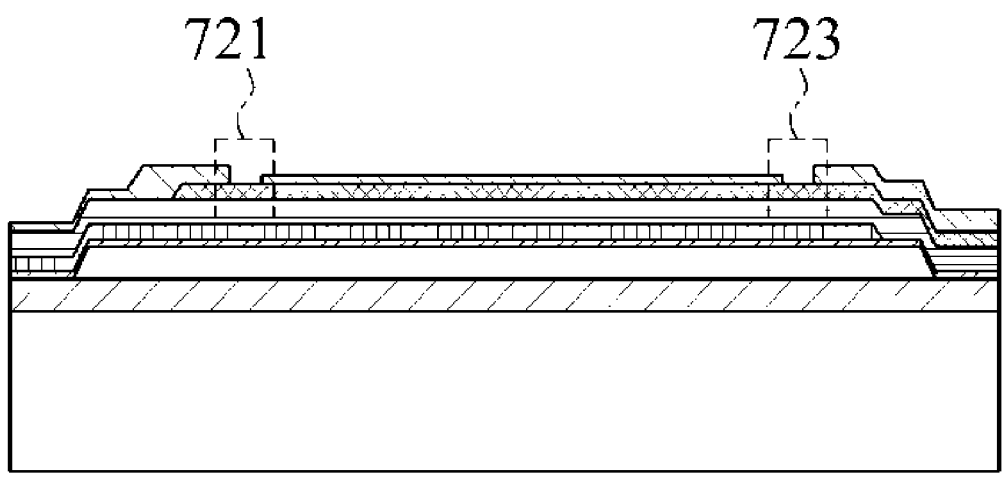
Figure 7C:
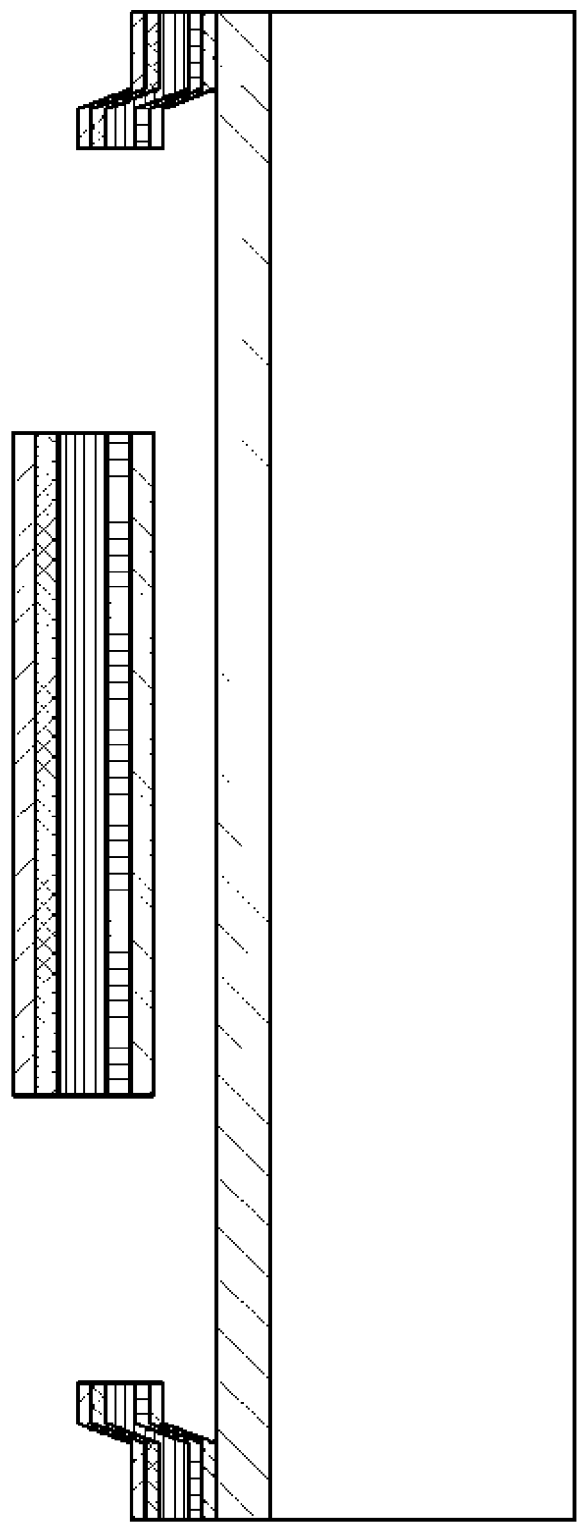

FIGS. 7A through 7C illustrate a top view and sectional views in accordance with an illustrative example of a BAWR.

FIG. 7A is the top view of the BAWR when a U-shaped frame is formed. FIG. 7B is the sectional view of the BAWR cut along a line 701. FIG. 7C is the sectional view of the BAWR cut along a line 703.

When compared to the BAWR of FIG. 6, the BAWR of FIG. 7 may include a frame 721 and a frame 723 that are formed based on a different scheme from that which was previously disclosed herein.

Referring to FIG. 7A, the frame 721 may be formed in a shape of U by locally etching a protective layer at a portion where a first electrode and the protective layer are in contact.

The frame 723 may be formed in a U shape by locally etching the protective layer at a portion where a second electrode and the protective layer are in contact.

A total thickness of films layered at a portion where the frame 721 is disposed and a total thickness of films layered at a portion where the frame 723 is disposed are less than thicknesses of remaining portions of the frames. Thus, a difference in impedance may occur due to a difference in the thicknesses of the films.

A horizontal acoustic wave generated from the first electrode and the second electrode may be reflected using a surface where the frame 721 is formed and a surface where the frame 723 is formed, as reflectors based on an impedance difference.

Referring to FIG. 7B, a thickness of films layered at a portion where the frame 721 is disposed and a thickness of films layered at a portion where the frame 723 is disposed may be less than thicknesses of remaining portions of the frames.

Referring to FIG. 7C, the BAWR may include an air edge, like the BAWR of FIG. 6C. A horizontal acoustic wave generated from the first electrode and the second electrode may be reflected using a surface where an air edge is formed and a surface where an air edge is formed, as reflectors based on an impedance difference.

Figure 8:
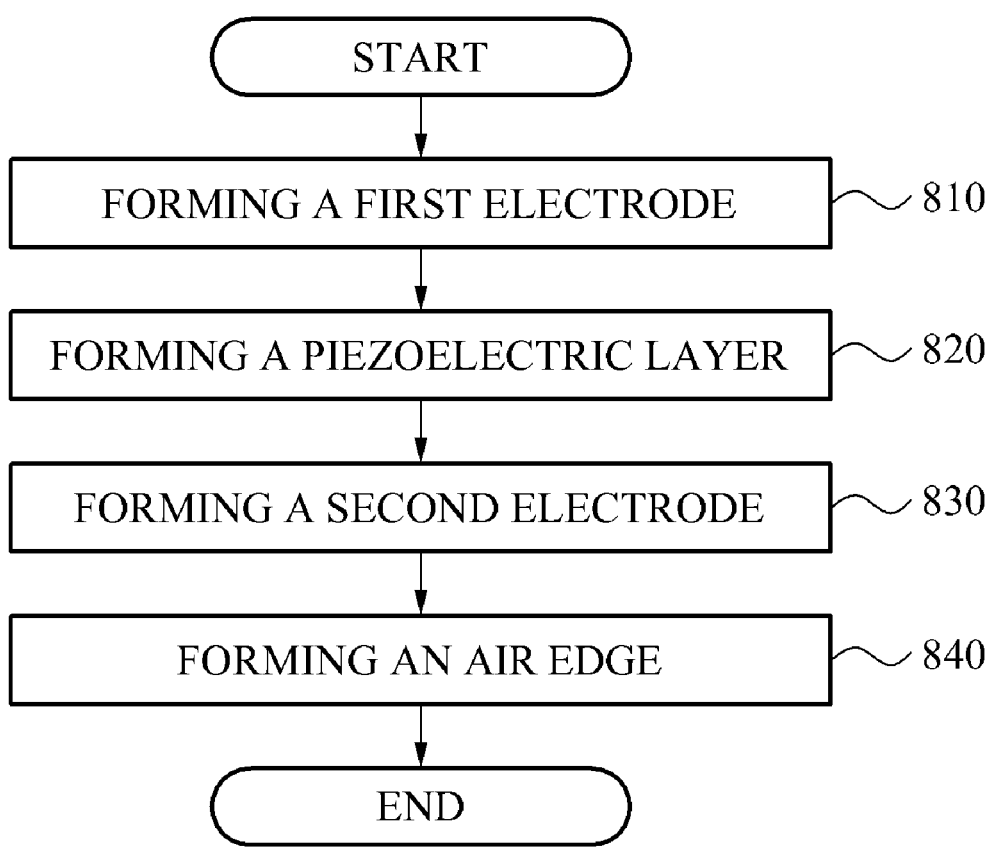
FIG. 8 is a flow chart illustrating a method of manufacturing a BAWR unit in accordance with an illustrative example.

FIG. 8 is a flow chart illustrating a method of manufacturing a BAWR unit in accordance with an illustrative example.

Referring to FIG. 8, at 810, the method forms the first electrode 115 of FIG. 1, by way of illustration, at 820 the method forms a piezoelectric layer 113 between the first electrode 115 and a second electrode 111 at 830. At 840, the method forms an air edge 120 or an air edge 130.

The units described herein may be implemented using hardware components and software components. For example, microphones, amplifiers, band-pass filters, audio to digital convertors, and processing devices. A processing device may be implemented using one or more general-purpose or special purpose computers, such as, for example, a processor, a controller and an arithmetic logic unit, a digital signal processor, a microcomputer, a field programmable array, a programmable logic unit, a microprocessor or any other device capable of responding to and executing instructions in a defined manner. The processing device may run an operating system (OS) and one or more software applications that run on the OS. The processing device also may access, store, manipulate, process, and create data in response to execution of the software. For purpose of simplicity, the description of a processing device is used as singular; however, one skilled in the art will appreciated that a processing device may include multiple processing elements and multiple types of processing elements. For example, a processing device may include multiple processors or a processor and a controller. In addition, different processing configurations are possible, such a parallel processors.

A number of illustrative examples have been described above. Nevertheless, it should be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. A film bulk acoustic wave resonator (BAWR), comprising:
   a resonance unit comprising
      a first electrode,
      a second electrode, and
      a piezoelectric layer disposed between the first electrode and the second electrode;
   an air gap disposed below the resonance unit; and
   an air edge provided distant from a center of the resonance unit to interface with the air gap before an edge of the air gap,
   wherein the air gap is configured to reflect acoustic waves of the resonance unit in a vertical direction and the air edge is configured to reflect acoustic waves of the resonance unit in a horizontal direction.

2. The BAWR of claim 1, wherein the air edge partially surrounds the resonance unit.

3. The BAWR of claim 2, wherein the air edge partially surrounds more than 20% of the resonance unit.

4. The BAWR of claim 3, further comprising an additional air edge, where the air edge and the additional air edge together surround at least 60% of the resonance unit.

5. The BAWR of claim 1, further comprising an additional air edge, with the air edge and the additional air edge partially surrounding the resonance unit.

6. The BAWR of claim 5, further comprising a frame aligned over an outer portion of the first electrode in the resonance unit.

7. The BAWR of claim 5, further comprising a frame, aligned over an outer portion of the first electrode in the resonance unit, etched in a form of a finger.

8. The BAWR of claim 5, wherein the second electrode comprises:
   a portion in a form of a finger, in contact with a portion of the resonance unit; and
   a patterned portion exposed to the air edge.

9. The BAWR of claim 5, wherein the air edge is formed in the vertical direction.

10. The BAWR of claim 5, wherein the resonance unit further comprises a membrane disposed above the air gap that maintains a shape of the air gap.

11. The BAWR of claim 1, wherein the air gap is disposed on a substrate.

12. The BAWR of claim 11, wherein the air edge is formed in the vertical direction.

13. The BAWR of claim 11, wherein the resonance unit further comprises a membrane disposed above the air gap and maintains a shape of the air gap.

14. The BAWR of claim 1, wherein the air edge is an enlargement of a via-hole that was used to generate the air gap.

15. The BAWR of claim 14, wherein the air edge partially surrounds the resonance unit.

16. The BAWR of claim 15, wherein the air edge partially surrounds more than 20% of the resonance unit.

17. The BAWR of claim 16, further comprising an additional air edge, with the air edge and the additional air edge surrounding about 60% of the resonance unit.

18. The BAWR of claim 14, wherein the air edge is formed in the vertical direction.

19. The BAWR of claim 14, wherein the resonance unit further comprises a membrane disposed above the air gap and maintains a shape of the air gap.

20. The BAWR of claim 14, wherein the first electrode, the second electrode, and the piezoelectric layer are etched in a single process, through application of a photo-mask layered on a portion different from an edge of the resonance unit so that the air edge has a steep slope.

21. The BAWR of claim 14, further comprising a frame aligned over an outer portion of the first electrode in the resonance unit.

22. The BAWR of claim 14, further comprising a frame, aligned over an outer portion of the first electrode, etched in a form of a finger.

23. The BAWR of claim 14, wherein the second electrode comprises:
   a portion in a form of a finger, in contact with a portion of the resonance unit; and
   a patterned portion exposed to the air edge.

24. The BAWR of claim 1, wherein the first electrode, the second electrode, and the piezoelectric layer are etched in a single process, through application of a photo-mask layered on a portion different from an edge of the resonance unit so that the air edge has a steep slope.

25. The BAWR of claim 1, further comprising a frame aligned over an outer portion of the first electrode in the resonance unit.

26. The BAWR of claim 1, wherein the air edge is an etched portion of the BAWR through respective portions of the first electrode, the piezoelectric layer, and the second electrode.

27. A film bulk acoustic wave resonator (BAWR), comprising:
   a resonance unit comprising
      a first electrode,
      a second electrode, and
      a piezoelectric layer disposed between the first electrode and the second electrode; and
   an air edge provided distant from a center of the resonance unit,
   wherein the first electrode comprises:
   a portion in a form of a finger, in contact with a portion of an edge of the resonance unit; and
   a patterned portion exposed to the air edge.

28. A film bulk acoustic wave resonator (BAWR), comprising:
   an air gap;
   a resonance unit comprising
      a first electrode disposed above the air gap,
      a piezoelectric layer disposed above the first electrode, and
      a second electrode disposed above the piezoelectric layer; and
   plural air edges formed at a distance from a center of the air gap and respectively interfacing with the air gap before an edge of the air gap,
   wherein the plural air edges are configured to control acoustic wave reflectivity of the resonance unit.

29. The BAWR of claim 28, further comprising a substrate, wherein the air gap is formed on the substrate.

30. The BAWR of claim 28, wherein the plural air edges include an air edge as an etched portion through respective portions, outside of the resonance unit, of the first electrode, the piezoelectric layer, and the second electrode.

* * * * *